US006660459B2

(12) United States Patent
Babcock

(10) Patent No.: US 6,660,459 B2
(45) Date of Patent: Dec. 9, 2003

(54) SYSTEM AND METHOD FOR DEVELOPING A PHOTORESIST LAYER WITH REDUCED PATTERN COLLAPSE

(75) Inventor: Carl P. Babcock, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/083,873

(22) Filed: Feb. 27, 2002

(65) Prior Publication Data

US 2002/0132184 A1 Sep. 19, 2002

Related U.S. Application Data

(60) Provisional application No. 60/275,852, filed on Mar. 14, 2001.

(51) Int. Cl.[7] .................................................. G03F 7/40
(52) U.S. Cl. ..................... 430/325; 430/326; 430/331
(58) Field of Search .............................. 430/325, 326, 430/331

(56) References Cited

U.S. PATENT DOCUMENTS

| 5,374,502 A | | 12/1994 | Tanaka et al. ............... 430/322 |
| 5,678,116 A | * | 10/1997 | Sugimoto et al. ........... 396/611 |
| 6,451,510 B1 | * | 9/2002 | Messick et al. ............. 430/325 |
| 6,554,507 B2 | * | 4/2003 | Namatsu ..................... 430/325 |

FOREIGN PATENT DOCUMENTS

| JP | 3-209715 | 9/1991 |
| JP | 7-106226 | 4/1995 |
| JP | 7-122485 | 5/1995 |
| JP | 8-62859 | 3/1996 |

OTHER PUBLICATIONS

"Aqueous–based Photoresist Drying using Supercritical Carbon Dioxide to Prevent Pattern Collapse" by Goldfarb, et al., 2000 American Vacuum Society, J. Vac. Sci. Technolog. B 18(6), Nov./Dec. 2000.

"Comparison of Resist Collapse Properties for Deep Ultraviolet and 193 nm Resist Platforms" by Cao, et al. 2000 American Vacuum Society, J. Vac. Sci. Technol. B 18(6), Nov./Dec. 2000.

"Sub–0.1 $\mu$ m Patterning with High Aspect Ratio of 5 Achieved by Preventing Pattern Collapse" by Yamashita Jpn. J. Appl. Phys. vol. 35 (1996) pp. 2385–2386, Part 1, No. 4A, Apr. 1996.

"X–Ray Lithography with a Wet–Silylated and Dry–Developed Resist" by Oizumi, et al., Jpn. J. Appl. Phys. vol. 34 (1995) pp. 6734–6737, Part 1, No. 12B, Dec. 1995.

"Prevention of Resist Pattern Collapse by Flood Exposure During Rinse Process" by Tanaka, et al., Jpn. J. Appl. Phys. vol. 33 (1994) pp. L1803–L1805, Part 2, No. 12B, Dec. 15, 1994.

"Sub–100 nm Focused Ion Beam Lithography Using Ladder Silicone Spin–on Glass" by Suzuki, et al., 1996 American Vacuum Society, J. Vac. Sci. Technol. B 14(6), Nov./Dec. 1996.

"Freeze–Drying Process to Avoid Resist Pattern Collapse" by Tanaka, et al., Jpn. J. Appl. Phys. vol. 32 (1993) pp. 5813–5814, Part 1, No. 12A, Dec. 1993.

(List continued on next page.)

Primary Examiner—Ronald L. Schilling
(74) Attorney, Agent, or Firm—Foley & Lardner

(57) ABSTRACT

A method of developing a photoresist layer on a semiconductor wafer in a developing chamber includes applying a developer to the photoresist layer, applying an alcohol rinse to the photoresist layer, and drying the wafer.

18 Claims, 2 Drawing Sheets

OTHER PUBLICATIONS

"Mechanism of Resist Pattern Collapse During Development Process" by Tanaka, et al., Jpn. J. Appl. Phys. vol. 32 (1993) pp. 6059–6064, Part 1, No. 12B, Dec. 1993.

"Mechanism of Resist Pattern Collapse" by Tanaka, et al., J. Electrochem Soc., vol. 140, No. 7, Jul. 1993.

"Patterning Characteristics of a Chemically–Amplified Negative Resist in Synchrotron Radiation Lithography" by Deguchi, et al., Jpn. J. Appl. Phys. vol. 31 (1992) pp. 2954–2958, Part 1, No. 9A, Sep. 1992.

"Collapse Behavior of KrF Resist Line Pattern Analyzed with Atomic Force Microscope Tip", by Kawai, Jpn. J. Appl. Phys. vol. 39 (2000) pp. 7044–7048 Part 1, No. 12B, Dec. 2000.

"Analysis of Resist Pattern Collapse and Optimization of DUV Process for Patterning sub–0.20 $\mu$m Gate Line" by Yu, et al., SPIE vol. 3333, pp. 880–889.

"Pattern Collapse in the Top Surface Imaging Process After Dry Development" by Mori, et al., 1998 American Vacuum Society, J. Vac. Sci. Technol. B 16(6), Nov./Dec. 1998.

* cited by examiner

SYSTEM AND METHOD FOR DEVELOPING A PHOTORESIST LAYER WITH REDUCED PATTERN COLLAPSE

CROSS-REFERENCE TO RELATED APPLICATIONS

This application claims the benefit of U.S. Provisional Application No. 60/275,852 filed Mar. 14, 2001.

FIELD OF THE INVENTION

The present specification relates generally to fabrication processes for integrated circuits (IC). More specifically, the present specification relates to an improved system for and method of developing a photoresist layer on a semiconductor substrate.

BACKGROUND

The semiconductor industries continue to manufacture semiconductor integrated circuits with higher and higher densities on a smaller chip area. The desire for large scale integration has led to a continued shrinking of the circuit dimensions and features of the devices so as to reduce manufacturing costs and to improve circuit functionality. The ability to reduce the size of structures such as gate lengths in field-effect transistors is driven by lithographic technology which is, in turn, dependent upon the wavelength of light used to expose the photoresist. In current IC fabrication processes, optical devices expose the photoresist to light having a wavelength of 248 nm (nanometers). Research and development laboratories are experimenting with light having a wavelength of 193 nm. Further, the next generation lithographic technologies will in all likelihood progress toward a radiation having a wavelength of 157 nm and even shorter wavelengths, such as those used in Extreme Ultra-Violet (EUV) lithography (e.g., 13 nm).

In a conventional lithographic process, after a semiconductor wafer is coated with photoresist and exposed to light with a circuit pattern, developer is applied to the photoresist to remove portions of the photoresist. The developer is removed with a water rinse and dried by a spinning process before subsequent etching.

One obstacle to the further reduction in printed feature size is the pattern collapse between photoresist lines or other photoresist features caused by the water rinse and drying step. FIGS. 1 and 2 illustrate the problems caused by this conventional technique. In FIG. 1, a wafer 10 is shown having photoresist lines 12. Rinse water 14 is illustrated after the rinsing step and just prior to drying. The inherent cohesive and adhesive forces of water create surface tension between photoresist lines 12 as the water evaporates. During the drying step, as shown in FIG. 2, fine photoresist lines 12 are pulled laterally by the surface tension, causing pattern collapse and ruining the resulting etch.

Currently, pattern collapse is avoided by limiting the printed feature size. One proposed solution is to freeze-dry a rinse liquid (i.e., tert-butanol). However, this method is time consuming, resulting in decreased throughput. Although the method could be done in batch processing, this adds complexity to the process. Another proposed solution is to use perfluorohexane as a rinser. However, perfluorohexane is difficult to dispose of. If pattern collapse can be reduced or eliminated, narrower features can be printed, thereby enabling higher microprocessor speeds and higher device density on the substrate.

Accordingly, there is a need for an improved system for and method of developing a photoresist layer. Further, there is a need for a system for and method of developing a photoresist layer to reduce or eliminate pattern collapse. Further still, there is a need for a system for and method of reducing surface tension caused by the water rinse during photoresist development. The teachings hereinbelow extend to those embodiments which fall within the scope of the appended claims, regardless of whether they accomplish one or more of the above-mentioned needs.

SUMMARY OF THE INVENTION

According to an exemplary embodiment, a method of developing a photoresist layer on a semiconductor wafer in a developing chamber includes applying a developer to the photoresist layer, applying an evaporating solution to the photoresist layer, and drying the photoresist layer.

According to another exemplary embodiment, a method of patterning a photoresist layer on a semiconductor wafer includes exposing the photoresist layer to light, developing portions of the photoresist layer with a photoresist developer, whereby photoresist lines remain on the wafer, rinsing the developed portions of the photoresist layer with an alcohol rinse, and drying the wafer.

According to yet another exemplary embodiment, an integrated circuit on a semiconductor substrate includes devices fabricated by a photolithographic process including the steps of: applying a photoresist layer to the semiconductor substrate; exposing the photoresist layer to light; developing portions of the photoresist layer with a photoresist developer, whereby photoresist lines remain on the wafer, rinsing the developed portions of the photoresist layer with an alcohol rinse, and drying the wafer.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION OF EXEMPLARY EMBODIMENTS

Figure 3:
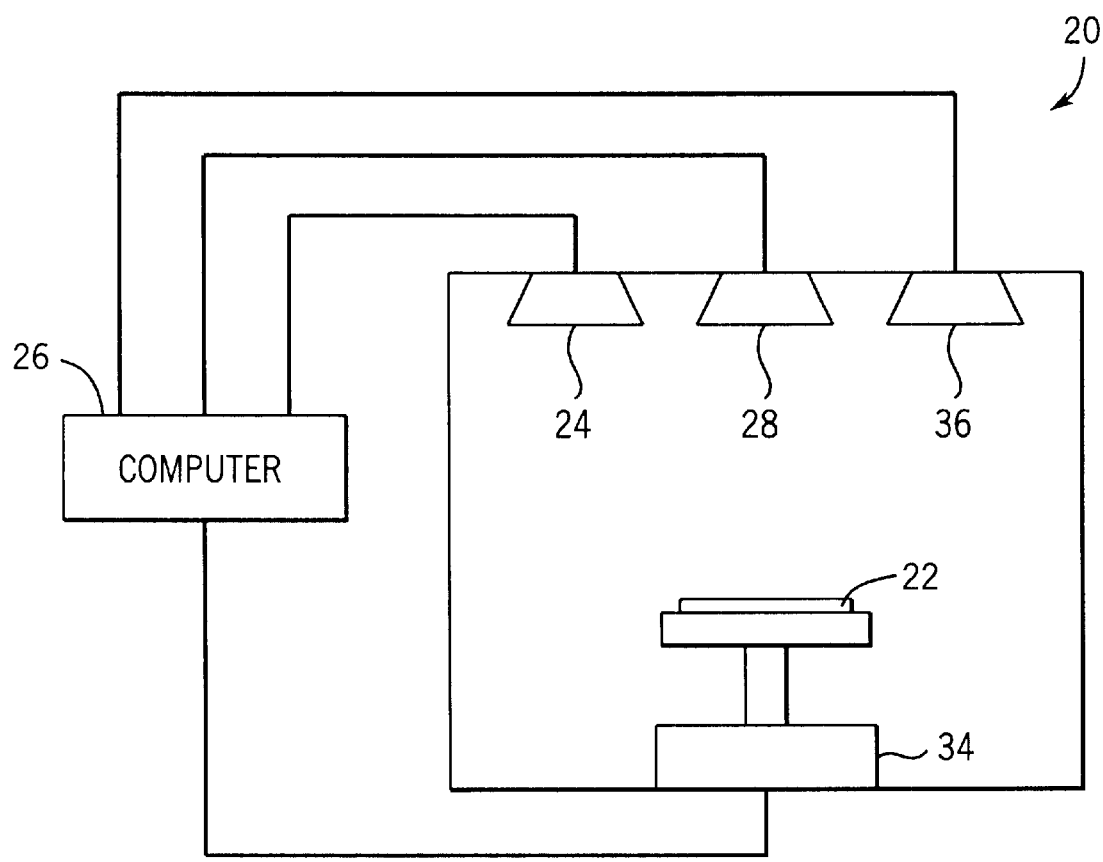
FIG. 3 is a schematic drawing of a developing chamber according to an exemplary embodiment.

Referring first to FIG. 3, a system and method for developing a photoresist layer having reduced pattern collapse will now be described. Conventional photolithographic techniques are first used to pattern a photoresist layer on a semiconductor wafer 22 by first applying a layer of photoresist to semiconductor wafer 22 (i.e., on wafer 22 or on a layer above wafer 22) and then exposing the photoresist layer to light through a mask. Wafer 22 may comprise silicon, germanium, etc. and may further be insulative, semiconductive, etc. The light source may be an excimer laser having a wavelength of 248 nm, 193 nm, 157 nm or less (e.g., EUV wavelengths). Other wavelengths are contemplated. The excimer laser may be a KrF laser, an ArF laser, or an $F_2$ laser. Advantageously, the system and method described herein may allow for the use of an excimer laser having a wavelength of 193 nm or less to produce printed features having lengths of 130 nm or less.

After the photoresist layer is exposed to the light, semiconductor wafer 22 is placed in a developing chamber 20. At the developing step, portions of the photoresist layer are removed from semiconductor wafer 22. The photoresist layer may be either a positive or a negative photoresist layer. The developing step may be carried out by immersion developing, spray developing in a batch or a single-wafer mode, puddle developing, or other developing techniques. A puddle developing technique is illustrated in FIG. 3.

A fixed amount of developer is first dispensed onto semiconductor wafer 22 from a developer dispenser 24. A computer 26 controls the amount, rate, and time of developer dispenser 24. Any of a variety of developers known in the art or hereinafter developed may be utilized, such as alkaline solutions diluted with water, organic solvents, etc. After the developer has developed the photoresist layer for a predetermined time, the developing action is stopped and portions of the photoresist layer are removed during a rinsing step.

A rinse dispenser 28 applies a stream of rinse to semiconductor wafer 22 and to the photoresist layer thereon under control from computer 26. Advantageously, an evaporating solution (e.g., an alcohol rinse) is provided to the photoresist layer on semiconductor wafer 22. Other evaporating solutions may be used. Preferably, the evaporating solution has a low surface tension (e.g., lower than the surface tension of water) and does not substantially dissolve the photoresist. An alcohol rinse is any composition of rinse containing an alcohol. The alcohol rinse may be 100% alcohol, or may include both water (e.g., deionized water, distilled water, etc.) and alcohol. Various types of alcohol may be used, such as, isopropanol, n-butyl alcohol, t-butyl alcohol, pentanol, hexanol, etc. Preferably, the alcohol rinse includes a sufficient concentration of alcohol to reduce surface tension between the photoresist lines remaining after the developer has removed portions of the photoresist layer.

Figure 1:
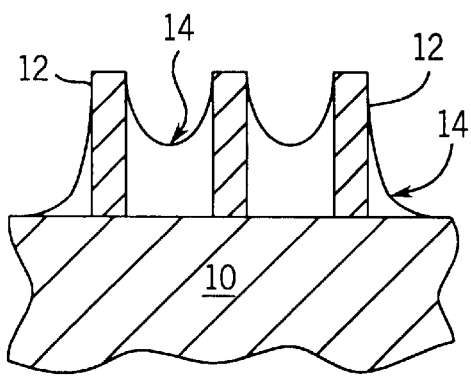
FIG. 1 is a schematic cross-sectional view of a semiconductor wafer having a water rinse according to a prior art method.
Figure 2:
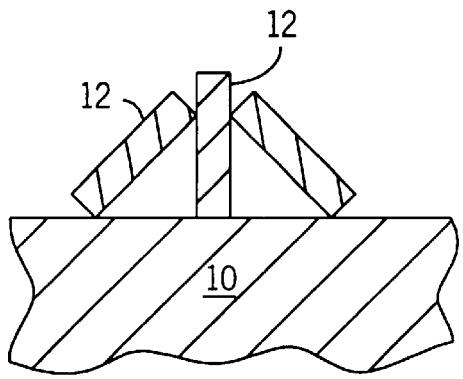
FIG. 2 is a schematic cross-sectional view of the semiconductor wafer of FIG. 1 having pattern collapse according to the prior art method.
Figure 4:
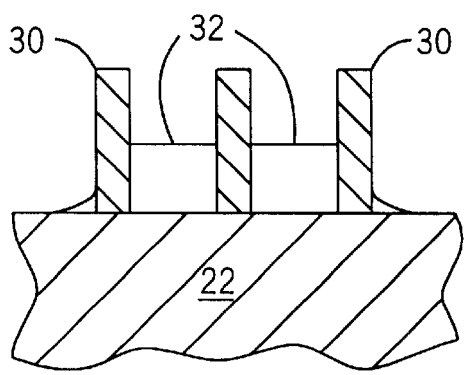
FIG. 4 is a schematic cross-sectional view of a semiconductor wafer having an alcohol rinse according to another exemplary embodiment.

Referring now to FIG. 4, a cross-sectional view of semiconductor wafer 22 is illustrated. Portions of the photoresist layer which remain after the developing step are indicated as photoresist lines 30. Alcohol rinse 32 is illustrated prior to drying. Notably, alcohol rinse 32 includes a sufficient concentration of alcohol to reduce surface tension between photoresist lines 30 in this exemplary embodiment. Depending on the type of alcohol, this is between 10% and 70% alcohol by weight. For example, a mixture of alcohol and water may be used. Further, alcohol rinse 32 preferably includes a sufficient concentration of water (e.g., between 30% and 90% water by weight) to prevent alcohol rinse 32 from dissolving photoresist lines 30. Advantageously, sufficient concentrations of alcohol and water are present in alcohol rinse 32 to prevent alcohol rinse 32 from affecting the shape and/or size of the photoresist, while minimizing surface tension. Further, alcohols are easier to dispose of than perfluorohexane.

According to one alternative embodiment, a pure water rinse may be applied first to the semiconductor wafer 22, followed by an alcohol rinse as described above. The alcohol rinse may include sufficient alcohol to replace most of the water rinse applied. In an embodiment where a pure water rinse is used prior to an alcohol rinse, the alcohol rinse contains sufficient alcohol to replace most of the water which is on the surface of wafer 22 and between adjacent photoresist lines 30 or other features. With the alcohol in place of the pure water rinse, the surface tension is reduced or eliminated. The surface tension may be reduced slightly by an alcohol rinse having a low alcohol concentration, or may be reduced greatly by an alcohol rinse having a large alcohol concentration. Preferably, the alcohol concentration of alcohol rinse 32 is such that the photoresist material is dissolved or deformed very little or not at all. Preferably, a concentration of alcohol to water is selected which both minimizes surface tension without affecting the shape or size of the photoresist (e.g., between approximately 10% and 70% alcohol to water by weight).

Figure 5:
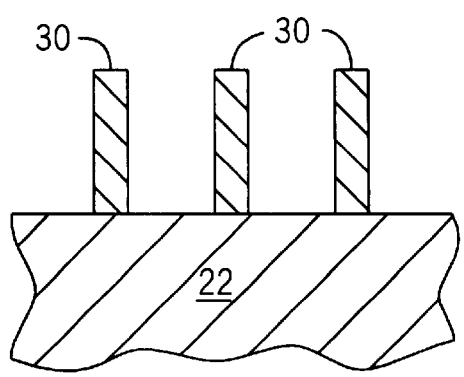
FIG. 5 is a schematic cross-sectional view of a semiconductor wafer after drying.

Referring now to FIG. 5, a subsequent drying step occurs under control from computer 26 via motor 34. Computer 26 drives motor 34 to spin semiconductor wafer 22 to remove developer, developed photoresist material, and alcohol rinse 32 either by evaporation, by physical removal, or some combination thereof. One or more water and/or alcohol rinses of varying concentrations and compositions may be applied to semiconductor wafer 22 before, during, or after spin drying with motor 34. Other drying methods are contemplated, which may include applying heat or a vacuum within chamber 20. According to one exemplary embodiment, wafer 22 is spin-dried for approximately 20 seconds at 4000 rotations per minute.

Advantageously, photoresist lines 30 will now no longer collapse. In prior art systems, drying semiconductor wafer 22 with a water rinse present between photoresist lines 30 caused pattern collapse. Advantageously, this surface tension is reduced or eliminated by using an alcohol rinse according to the exemplary embodiment described herein.

According to a further advantageous embodiment, computer 26 may control the environment within chamber 20 before or during the drying step. Computer 26 may control the humidity and the concentration of alcohol vapor in developing chamber 20 via an environmental dispenser 36. The humidity and the concentration of alcohol vapor in the developing chamber 20 may be optimized to reduce the surface tension of the alcohol rinse on semiconductor wafer 22.

Referring again to FIG. 5, the improved developing system and method disclosed herein allows the formation of photoresist lines 30 having a high aspect ratio (preferably greater than 3), thereby enabling the etching of narrower features in semiconductor wafer 22 than was previously possible. For example, features having a printed feature size or a critical dimension (CD) of 130 nm or less (preferably 60 nm or less) is possible without pattern collapse. Photoresist lines 30 are illustrated in FIG. 5 on a semiconductor wafer 22, but may alternatively be applied over various layers or levels of insulators, conductors, vias, semiconductors, or other layers fabricated on semiconductor wafer 22.

According to yet another advantageous aspect, very narrow (preferably less than 60 nanometer), high aspect ratio resist lines may be printed without pattern collapse.

Figure 6:
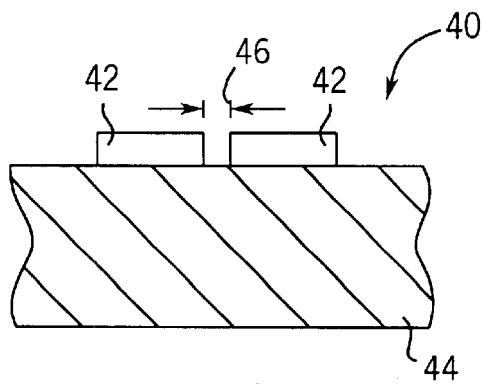
FIG. 6 is a schematic cross-sectional view of an integrated circuit fabricated on a semiconductor wafer according to an exemplary embodiment.

Referring now to FIG. 6, an integrated circuit 40 on a semiconductor substrate 44 includes devices 42 fabricated using the photolithographic process disclosed hereinabove. One feature 46 of devices 42 has a length of 130 nm or less in this exemplary embodiment. This feature length is enabled by the high aspect ratio of photoresist lines 30.

Devices 42 may be conductive elements, such as gates for metal-oxide-semiconductor field effect transistors (MOSFETs) or other devices. An excimer laser having a wavelength of 193 nanometers or less may be used in this exemplary embodiment.

While the exemplary embodiments illustrated in the FIGS. and described above are presently preferred, it should be understood that these embodiments are offered by way of example only. For example, various alcohols may be used in alcohol rinse 32 to achieve the desired results. Further, the alcohol rinse may be used at various times during development and/or rinse and/or drying steps. Accordingly, the present invention is not limited to a particular embodiment, but extends to various modifications that nevertheless fall within the scope of the appended claims.

What is claimed is:

1. A method of developing a photoresist layer on a semiconductor wafer in a developing chamber, comprising:

applying a developer and light to the photoresist layer;

rinsing the developed photoresist layer with a first alcohol rinse, whereby portions of the photoresist layer are removed;

drying the photoresist layer; and rinsing the photoresist layer with a second alcohol rinse.

2. The method of claim 1, wherein the second alcohol rinse includes alcohol and water.

3. The method of claim 2, wherein the first alcohol rinse includes alcohol is selected from the group consisting of isopropanol, n-butyl alcohol, t-butyl alcohol, pentanol, and hexanol.

4. The method of claim 3, further comprising providing an alcohol vapor in the developing chamber, wherein the alcohol vapor has a composition sufficient to reduce surface tension between photoresist lines.

5. The method of claim 3, wherein the first alcohol rinse includes a sufficient concentration of alcohol to reduce surface tension between photoresist lines.

6. The method of claim 4, wherein the first alcohol rinse includes a sufficient concentration of water to prevent the evaporating solution from dissolving the photoresist layer.

7. The method of claim 1, further comprising applying a water rinse to the photoresist layer before applying the first alcohol rinse.

8. The method of claim 7, wherein the first alcohol rinse includes sufficient alcohol to replace most of the water on the photoresist coating.

9. The method of claim 1, wherein the first alcohol rinse does not substantially dissolve the photoresist layer.

10. The method of claim 1, wherein the step of drying includes spinning the semiconductor wafer.

11. The method of claim 1, wherein the first alcohol rinse includes between 10% and 70% alcohol by weight.

12. The method of claim 11, wherein the first alcohol rinse includes between 30% and 90% water by weight.

13. A method of patterning a photoresist layer on a semiconductor wafer, comprising:

exposing the photoresist layer to light;

developing portions of the photoresist layer with a photoresist developer, whereby photoresist lines remain on the wafer;

rinsing the developed portions of the photoresist layer with a first alcohol rinse;

drying the wafer; and providing a second alcohol rinse before, during, or after the drying step.

14. The method of claim 13, wherein the photoresist lines provide printed features 130 nanometers in length or less.

15. The method of claim 13, wherein the first alcohol rinse is between 30% and 70% alcohol by weight and between 30% and 90% water by weight.

16. The method of claim 13, wherein the first alcohol rinse includes alcohol and water.

17. The method of claim 15, wherein the first alcohol rinse includes a sufficient concentration of alcohol to reduce surface tension between photoresist lines.

18. The method of claim 13, wherein the light has a wavelength of 193 nanometers or less.

\* \* \* \* \*